(12) United States Patent
Tanaka et al.

(10) Patent No.: US 6,569,608 B2
(45) Date of Patent: May 27, 2003

(54) METHOD OF MANUFACTURING AN ELEMENT WITH MULTIPLE-LEVEL SURFACE

(75) Inventors: Ichiro Tanaka, Utsunomiya (JP); Eiichi Murakami, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/398,010

(22) Filed: Sep. 17, 1999

(65) Prior Publication Data

US 2002/0042024 A1 Apr. 11, 2002

(30) Foreign Application Priority Data

Sep. 18, 1998 (JP) .............................. 10-283445

(51) Int. Cl.$^7$ ................................ G03C 5/00
(52) U.S. Cl. ...................... 430/394; 430/321; 430/322; 430/323; 430/324; 430/326; 359/558; 356/399
(58) Field of Search ................................ 430/221, 322, 430/323, 324, 326, 394; 359/558; 356/399

(56) References Cited

U.S. PATENT DOCUMENTS

| | | | | |
|---|---|---|---|---|
| 4,948,706 A | * | 8/1990 | Sugihara et al. | 430/311 |
| 4,985,374 A | * | 1/1991 | Tsuji et al. | 437/229 |
| 5,017,403 A | * | 5/1991 | Pang et al. | 427/39 |
| 5,218,471 A | * | 6/1993 | Swanson et al. | 359/565 |
| 5,324,600 A | | 6/1994 | Jinbo et al. | 430/5 |
| 5,348,828 A | * | 9/1994 | Murata et al. | 430/20 |
| 5,568,291 A | * | 10/1996 | Murata et al. | 359/67 |
| 5,599,741 A | * | 2/1997 | Matsumoto et al. | 437/192 |
| 5,837,405 A | * | 11/1998 | Tomofuji et al. | 430/5 |
| 5,953,585 A | * | 9/1999 | Miyaguchi | 438/35 |
| 5,995,285 A | | 11/1999 | Unno | 359/565 |
| 6,030,700 A | * | 2/2000 | Forrest et al. | 428/336 |
| 6,037,005 A | * | 3/2000 | Moshrefzadeh et al. | 427/286 |
| 6,120,950 A | * | 9/2000 | Unno | 430/30 |
| 6,133,614 A | * | 10/2000 | Shoji et al. | 257/443 |
| 6,301,001 B1 | * | 10/2001 | Unno | 355/67 |

FOREIGN PATENT DOCUMENTS

| | | |
|---|---|---|
| JP | 61-44628 | 3/1986 |
| JP | 61-137101 | 6/1986 |
| JP | 62-42102 | 2/1987 |
| JP | 4-345101 | 12/1992 |
| JP | 6-160610 | 6/1994 |
| JP | 7-72319 | 3/1995 |
| JP | 8-15510 | 1/1996 |
| JP | 2000-47015 | 2/2000 |

* cited by examiner

Primary Examiner—Janet Baxter
Assistant Examiner—Barbara Gilliam
(74) Attorney, Agent, or Firm—Fitzpatrick, Cella, Harper & Scinto

(57) ABSTRACT

A method of manufacturing an element having a multiple-level step-like shape through plural lithographic processes, or a mold for production of such an element is disclosed, wherein a position of at least one step of the step-like shape is determined by an end of at least a portion of a pattern of a first mask to be formed through a first lithographic process of the plural lithographic processes.

26 Claims, 25 Drawing Sheets

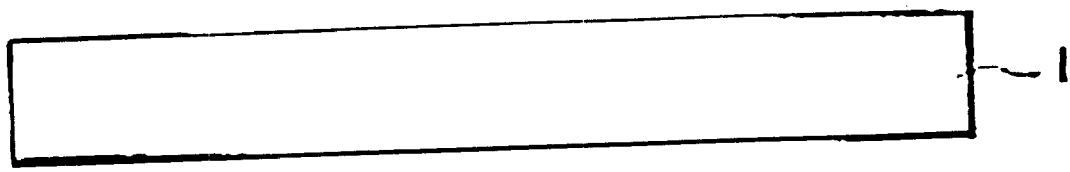
F I G. 1
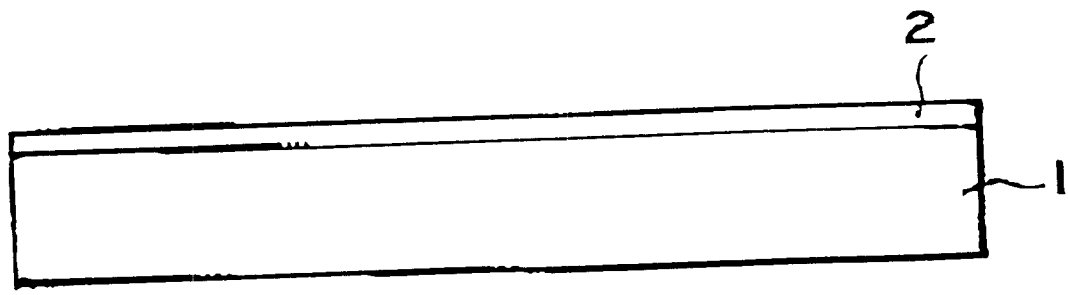
F I G. 2
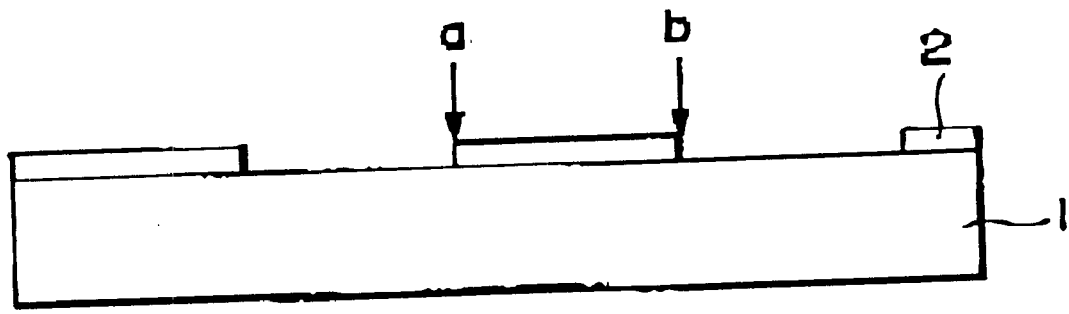
F I G. 3

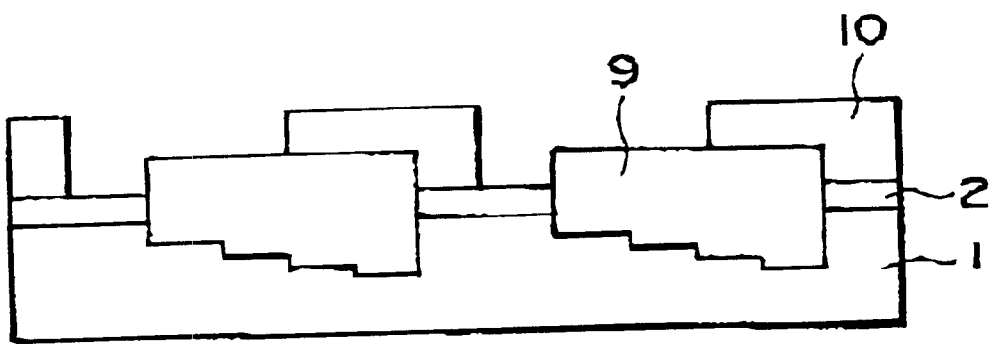
F I G. 16
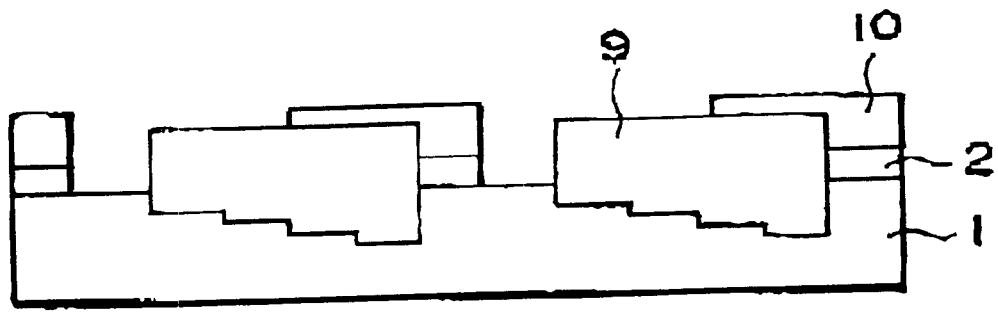
F I G. 17
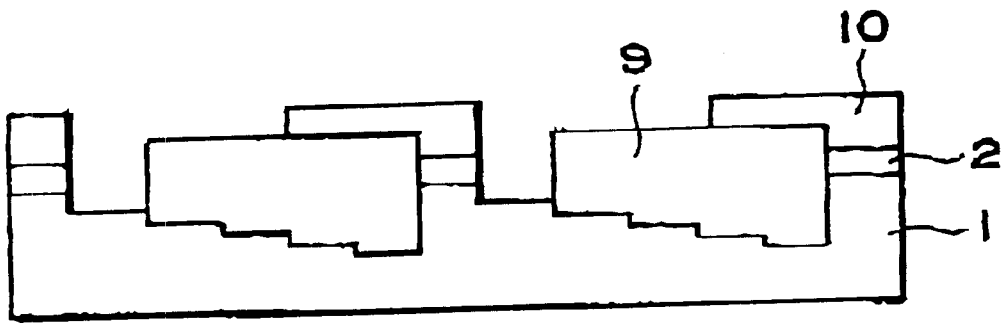
F I G. 18

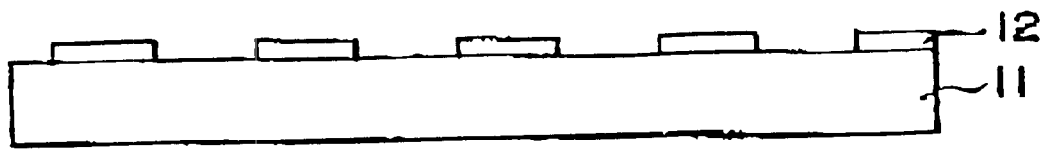
F I G. 22
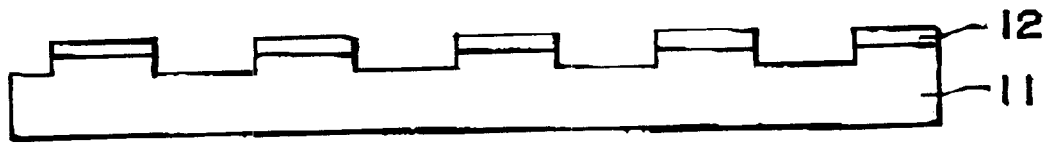
F I G. 23
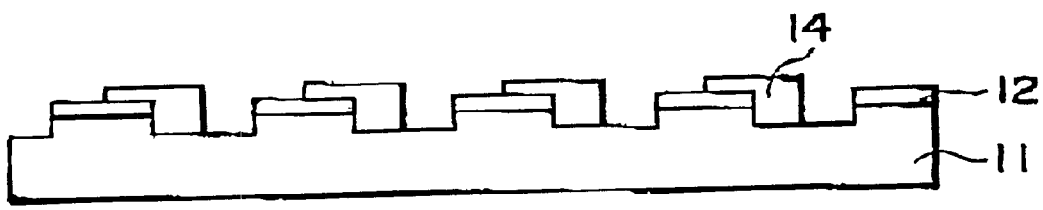
F I G. 24
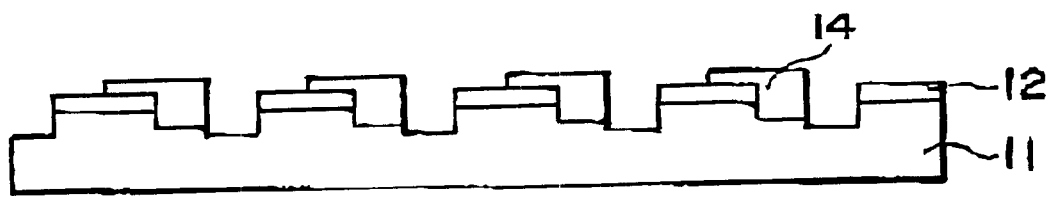
F I G. 25
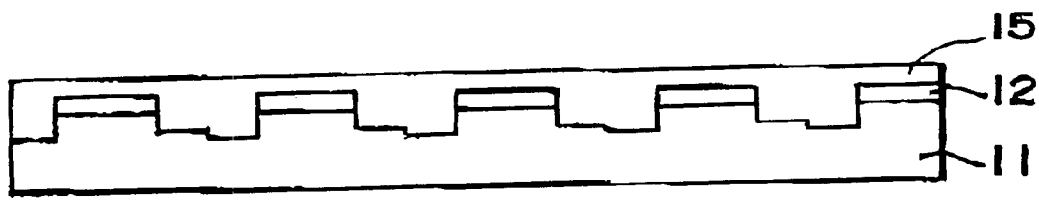
F I G. 26

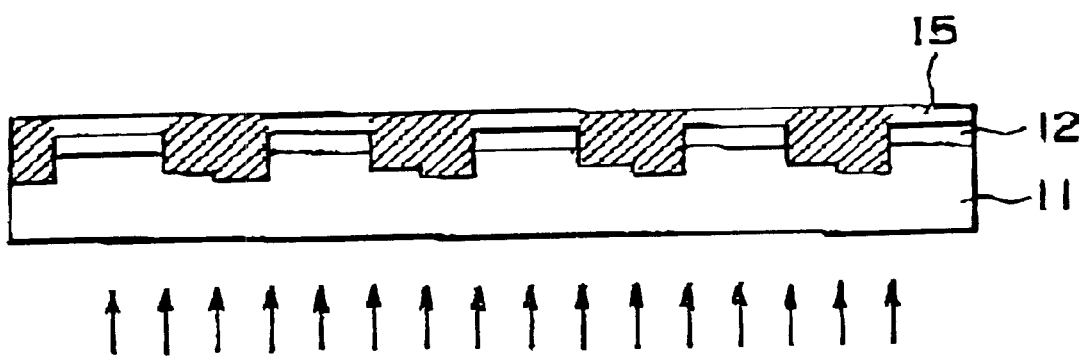
F I G. 27
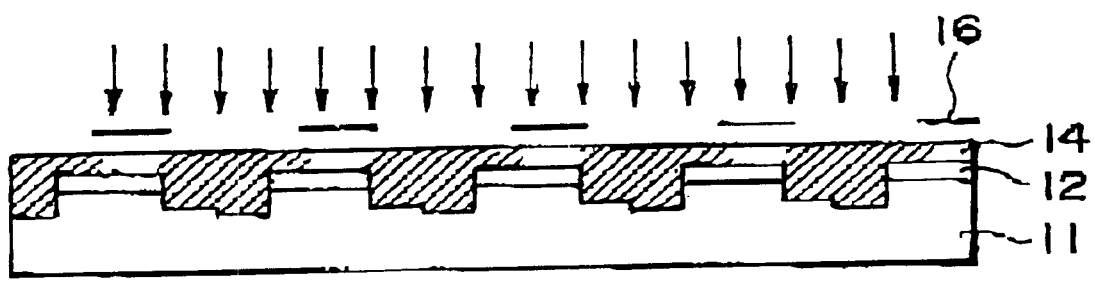
F I G. 28
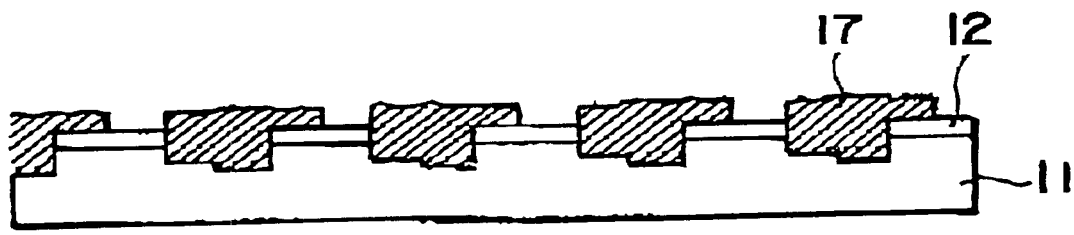
F I G. 29

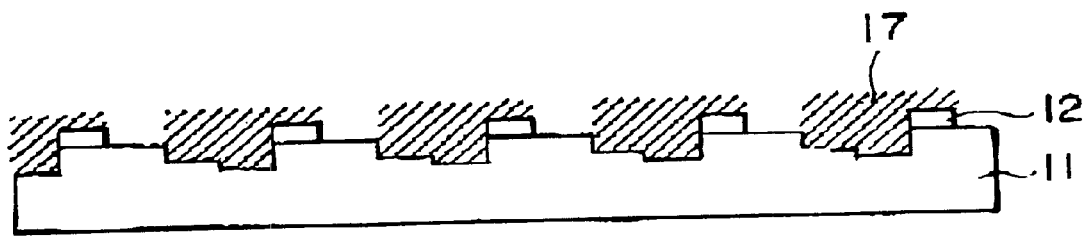
F I G. 30
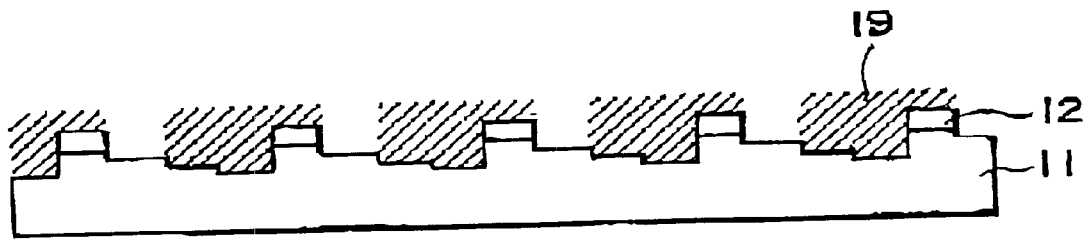
F I G. 31
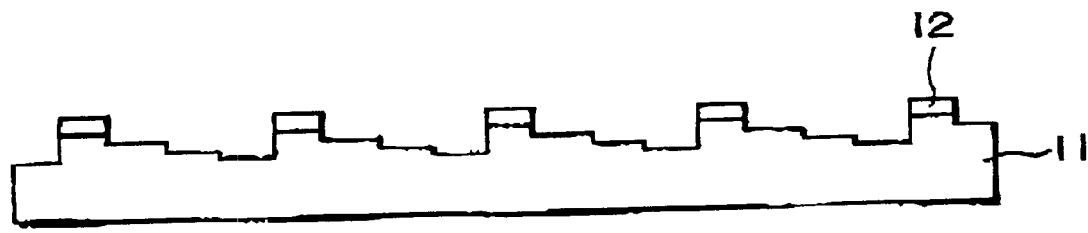
F I G. 32

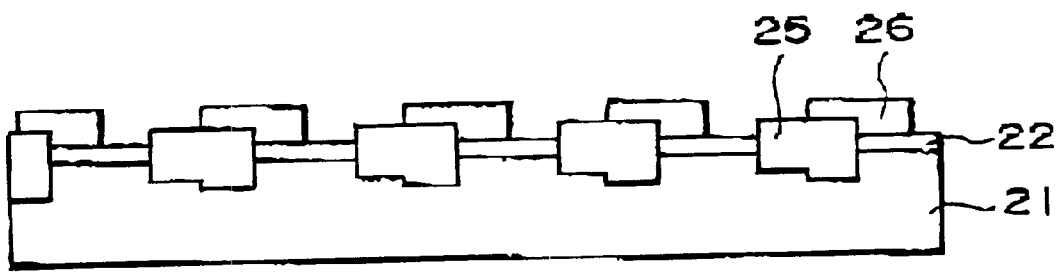
F I G. 42
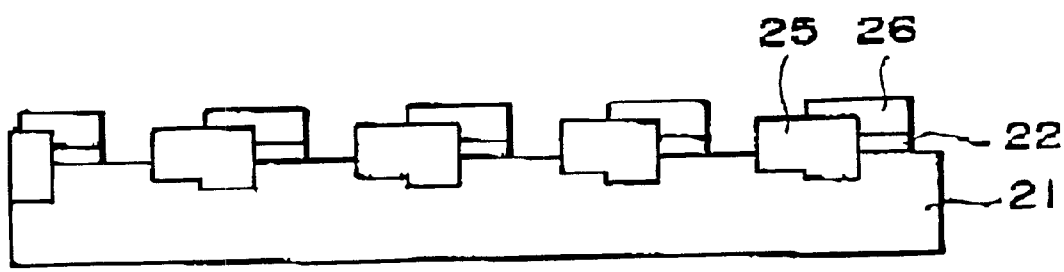
F I G. 43
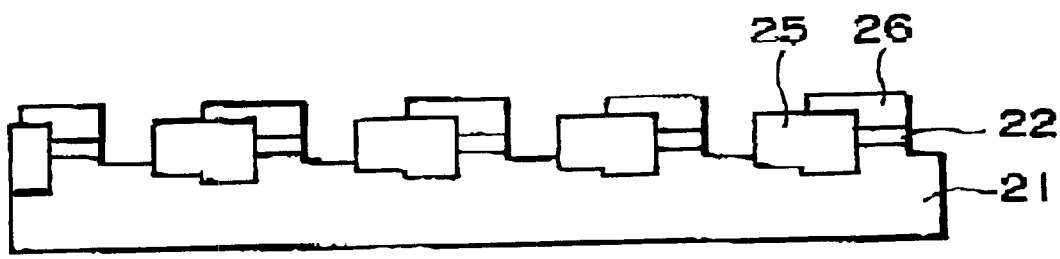
F I G. 44

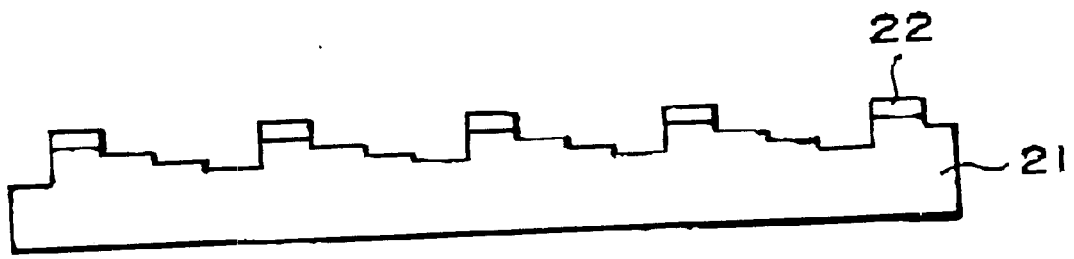
F I G. 45
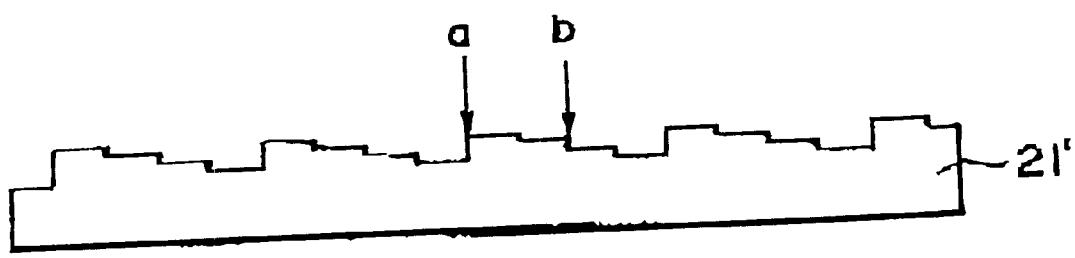
F I G. 46
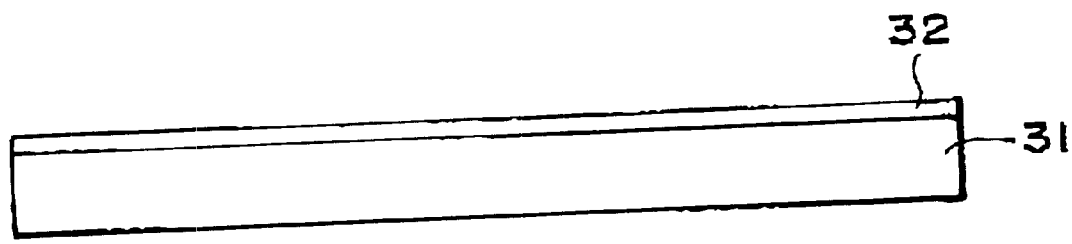
F I G. 47

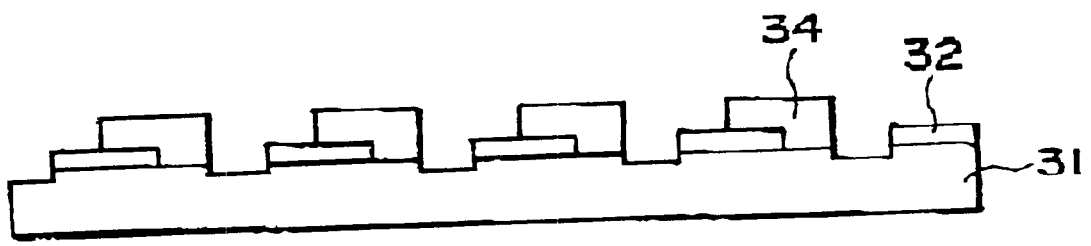
F I G. 51
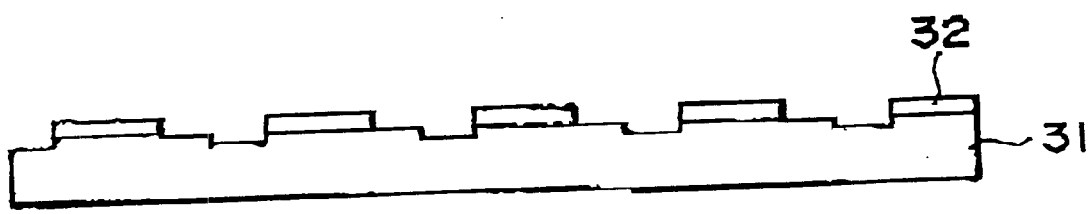
F I G. 52
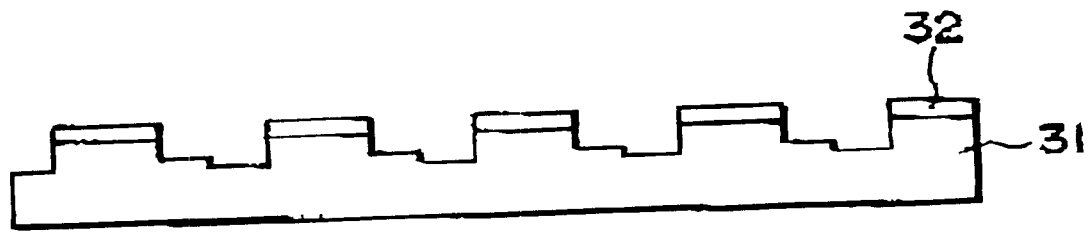
F I G. 53

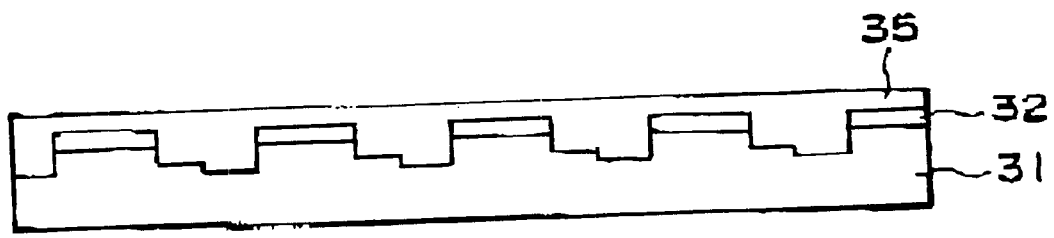
F I G. 54
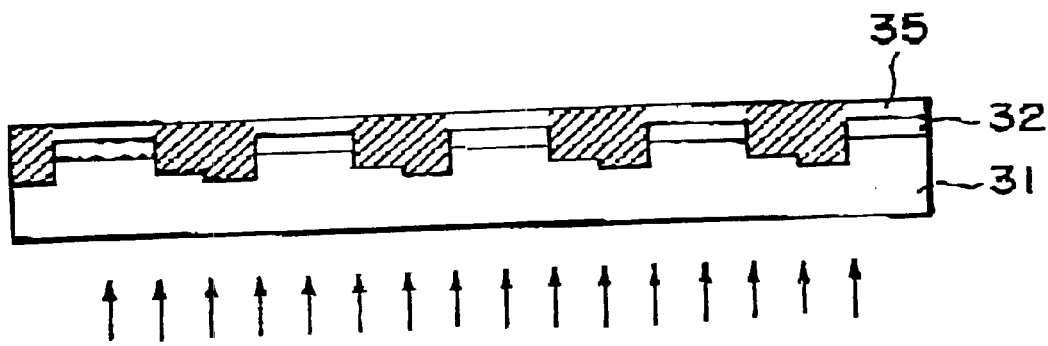
F I G. 55
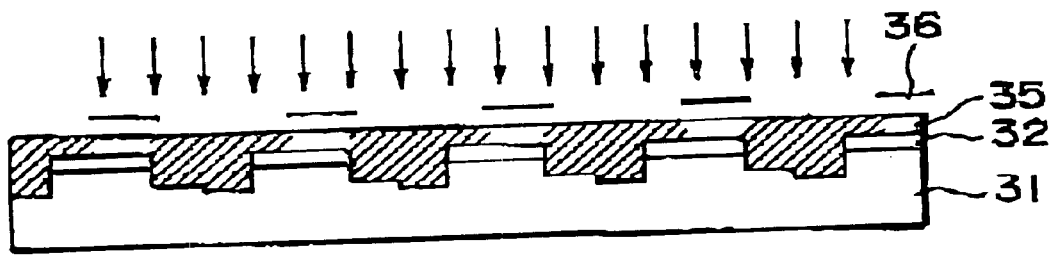
F I G. 56

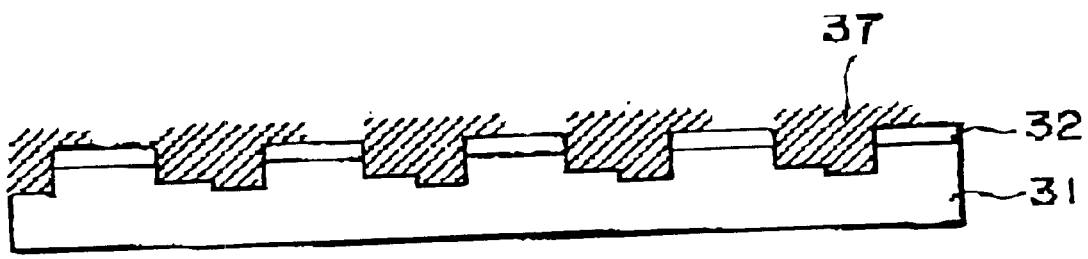
F I G. 57
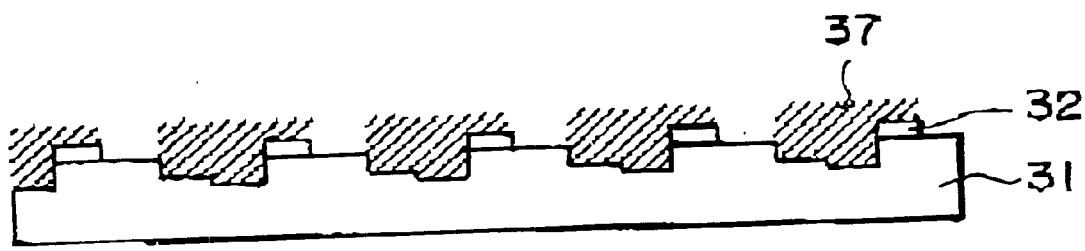
F I G. 58
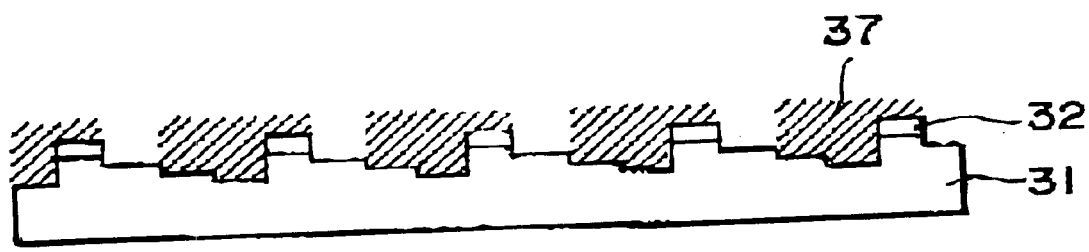
F I G. 59

F I G. 60
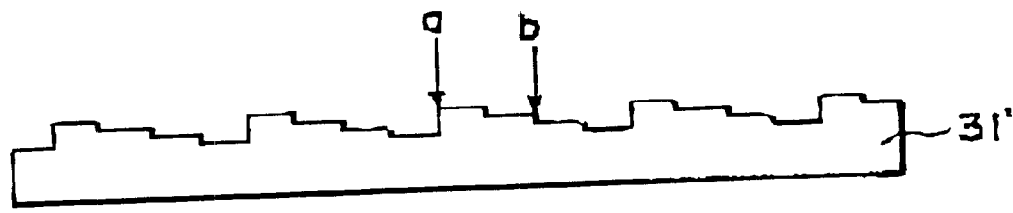
F I G. 61
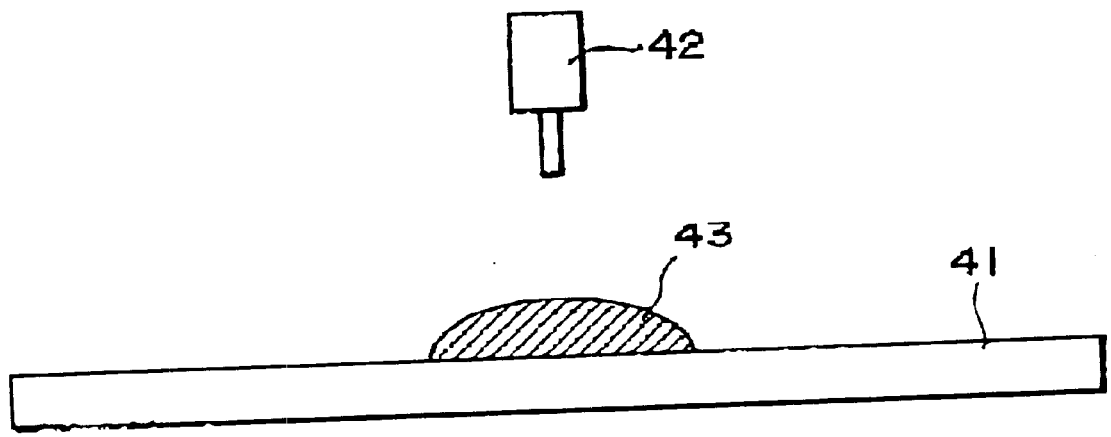
F I G. 62

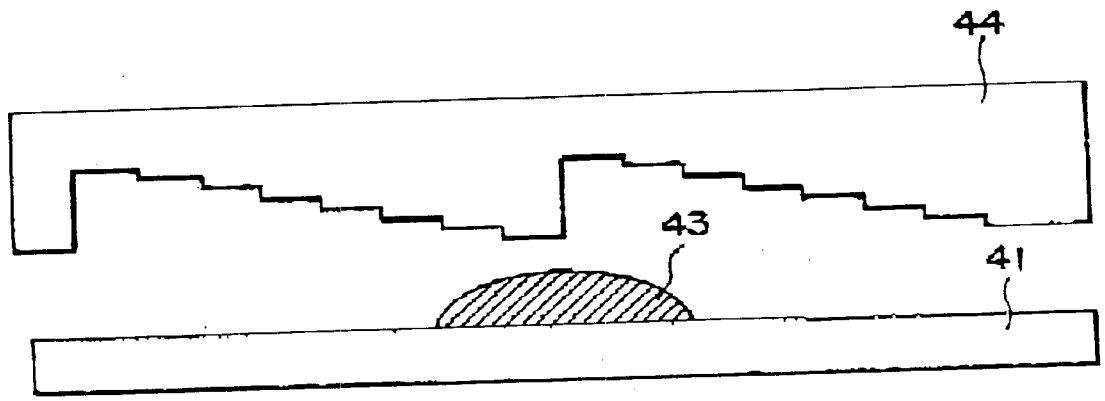
F I G. 63
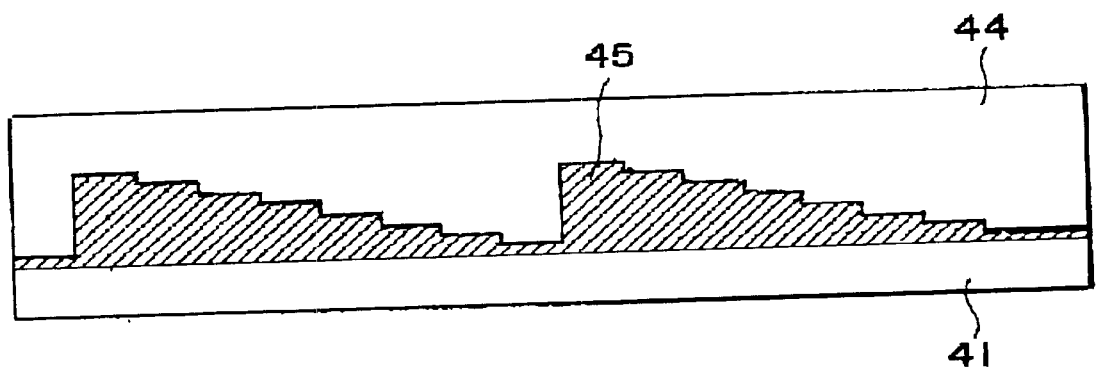
F I G. 64

METHOD OF MANUFACTURING AN ELEMENT WITH MULTIPLE-LEVEL SURFACE

BACKGROUND OF THE INVENTION

Field of the Invention

This invention relates to a method of manufacturing an element with a multiple-level step-like structure such as a diffractive optical element, a Fresnel lens, a phase type computer hologram (CGH), or a mask for the CGH, for example, more particularly, an element having a very fine surface-step pattern such as a diffractive optical element, for example, usable in manufacture of a semiconductor integrated circuit, for example. In another aspect, the invention is concerned with a method of manufacturing a mold for producing such an element.

Fujita, et al. ("Journal of Electronic Communication Association", (C) J66-CP85–91, January, 1983) and Japanese Laid-Open Patent Application, Laid-Open No. 26560/1987 as well as Japanese Laid-Open Patent Application, Laid-Open No. 42102/1987 disclose a method wherein a step-like shape is formed by using an electron beam while controlling its dose quantity, and wherein a resist is used directly as a circuit pattern.

Japanese Laid-Open Patent Application, Laid-Open No. 137101/1986 discloses a method wherein two or more types of films having an etching durability are accumulated with a desired thickness, wherein the layers are etched from the top layer to provide a step-like structure, whereby a mold is formed.

Japanese Laid-Open Patent Application, Laid-Open No. 44628/1986 and Japanese Laid-Open Patent Application, Laid-Open No. 160610/1994 disclose a method wherein, while a resist is used as an etching mask, a step-like structure is formed on the basis of a sequential alignment for the steps, whereby a mold is formed.

Japanese Laid-Open Patent Application, Laid-Open No. 15510/1996 discloses a method wherein an etching stopper layer is used and, for each step, an etching stopper layer and a transparent layer are accumulated, and wherein a step-like structure is formed through alignment, exposure and etching.

Japanese Laid-Open Patent Application, No. 26339/1994 which corresponds to Japanese Laid-Open Patent Application, Laid-Open No. 72319/1995 and U.S. Pat. No. 5,324,600 disclose a method wherein an alignment operation is performed while using a resist as an etching mask, and a step-like structure is formed.

In these examples, however, the minimum size is determined by the smallest resolution of a drawing apparatus and, therefore, it is not easy to produce a very fine shape.

A multiple-level step-like diffractive optical element can be manufactured as a diffractive optical element having a step-like sectional shape, in accordance with photolithographic processes based on exposure and etching techniques that are used in semiconductor manufacture. In such a multiple-level step-like diffractive optical element, the function of a diffractive optical element is performed by step-like surface level differences (steps) formed on a substrate.

Therefore, the optical performance of the multiple-level step-like diffractive optical element, particularly, the diffraction efficiency, depends on the shape of the formed surface step, that is, depth, width, or sectional shape of the step, for example. Specifically, where plural masks are used, an alignment error between them largely influences the diffraction efficiency.

For example, where a step-like shape is to be formed by using masks of harmonic frequencies sequentially, an idealistic step-like shape can be formed if there is no alignment error or line width error. Practically, however, it is very difficult to remove the line width error or the alignment error completely and, therefore, the produced shape differs from the idealistic shape. Basically the same problem is involved in other methods.

Referring to a specific example, as shown in FIG. 70, idealistically an eight-level (step) shape can be produced by using three masks, that is, masks A, B and C. If any misregistration occurs between the masks A and B, a problem arises. FIG. 70 shows the resultant shape when there are alignment deviations $d_b$ and $d_c$ among the masks A, B and C. If the illustrated shape results, the optical performance of the optical element D such as diffraction efficiency, for example, considerably degrades.

Also, if there is a line width error at each layer, the optical performance such as diffraction efficiency further degrades. In the case of electron beam drawing, there may be no alignment error. However, a bulky drawing operation is required and, therefore, a sufficient throughput with respect to the productivity is not attainable.

SUMMARY OF THE INVENTION

It is an object of the present invention to provide an improved method of manufacturing an element having an accurate and very fine step-like shape.

It is another object of the present invention to provide a method of manufacturing a mode for producing an element having an accurate and very fine step-like shape.

In accordance with an aspect of the present invention, there is provided a method of manufacturing an element having a multiple-level step-like shape through plural lithographic processes, wherein a position of at least one step of the step-like shape is determined by an end of at least a portion of a pattern of a first mask to be formed through a first lithographic process of the plural lithographic processes.

In accordance with another aspect of the present invention, there is provided a method of manufacturing a mold for production of an element having a multiple-level step-like shape through plural lithographic processes, wherein a position of at least one step of the step-like shape is determined by an end of at least a portion of a pattern of a first mask to be formed through a first lithographic process of the plural lithographic processes.

In one preferred form of these aspects of the present invention, the method includes (i) a first process for etching a portion of a base material not covered by the first mask to a predetermined depth, (ii) a second process for forming a second mask so that it covers a particular region of a portion of the base material not covered by the first mask and also that it overlaps with the first mask and, subsequently, for etching the base material to a predetermined depth by using the first and second masks as an etching mask, and (iii) a third process in which, after the second mask is separated, the second process is repeated as required and, after the second mask is separated, a third mask is used to cover the portion not covered by the first mask, in which a fourth mask is formed so that an end of a pattern of the fourth mask lines at an end portion of the pattern of the first mask while an opposite end of the pattern of the fourth mask overlaps with the pattern of the third mask, and in which, after the fourth mask is formed, an exposed portion of the first mask is removed by etching so that the base material is exposed, and, subsequently, the exposed portion of the base material is etched to a predetermined depth, wherein the third process is repeated at least once, as required, after the third and fourth masks are separated.

In another preferred form of these aspects of the present invention, the method includes (i) a first process for etching a portion of a base material not covered by the first mask to a predetermined depth, (ii) a second process for forming a second mask so that it covers a particular region of a portion of the base material not covered by the first mask and also that it overlaps with the first mask and, subsequently, for etching the base material to a predetermined depth by using the first and second masks as an etching mask, and (iii) a third process in which the second process is repeated as required after the second mask is separated and, after the second mask is separated, a third mask is formed so that it covers the portion not covered by the first mask and that an end of a pattern of the third mask lies at an end portion of the pattern of the first mask while an opposite end of the pattern of the third mask lies on the first mask, and in which, after the third mask is formed, an exposed portion of the first mask is etched, wherein the third process is repeated as required after the third mask is separated.

In a further preferred form of these aspects of the present invention, the method includes (i) a first process for forming a second mask so that it covers a particular region of a portion of a base material not covered by the first mask and, subsequently, for etching the base material to a predetermined depth by using the first and second masks as an etching mask to remove the second mask, (ii) a second process for repeating the first process, at least once, so that the portion of the base material not covered by the first mask is etched to a predetermined depth, and (iii) a third process in which a third mask is used to cover the portion not covered by the first mask, in which a fourth mask is formed so that an end of the fourth mask lies on the first mask while an opposite end of the pattern of the fourth mask overlaps with the third mask, and in which, after the fourth mask is formed, an exposed portion of the first mask is removed by etching so that the base material is exposed and, subsequently, the exposed portion of the base material is etched to a predetermined depth, wherein the third process is repeated as required after the third mask is separated.

In a still further preferred form of these aspects of the present invention, the method includes (i) a first process for forming a second mask so that it covers a particular region of a portion of a base material not covered by the first mask and, subsequently, for etching the base material to a predetermined depth by using the first and second masks as an etching mask to remove the second mask, (ii) a second process for repeating the first process at least once so that the portion of the base material not covered by the second mask is etched to a predetermined depth, and (iii) a third process in which a third mask is formed, after the second mask is separated, so that the third mask covers at least the portion not covered by the first mask and also that an end of a pattern of the third mask lies at an end of a pattern of the first masks while an opposite end of the pattern of the third mask lies on the first mask, and in which, after the third mask is formed, an exposed portion of the first mask is removed by etching so that the base material is exposed and, subsequently, the exposed portion of the base material is etched to a predetermined depth, wherein the third process is repeated as required after the third mask is separated.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1–19 are sectional views, respectively, for explaining the manufacturing processes in accordance with a first embodiment of the present invention.

FIGS. 20–33 are sectional views, respectively, for explaining the manufacturing processes in accordance with a second embodiment of the present invention.

FIGS. 34–46 are sectional views, respectively, for explaining the manufacturing processes in accordance with a third embodiment of the present invention.

FIGS. 47–61 are sectional views, respectively, for explaining the manufacturing processes in accordance with a fourth embodiment of the present invention.

FIGS. 62–65 are sectional views, respectively, for explaining the manufacturing processes in accordance with a fifth embodiment of the present invention.

DESCRIPTION OF THE PREFERRED EMBODIMENTS

Figure 69:
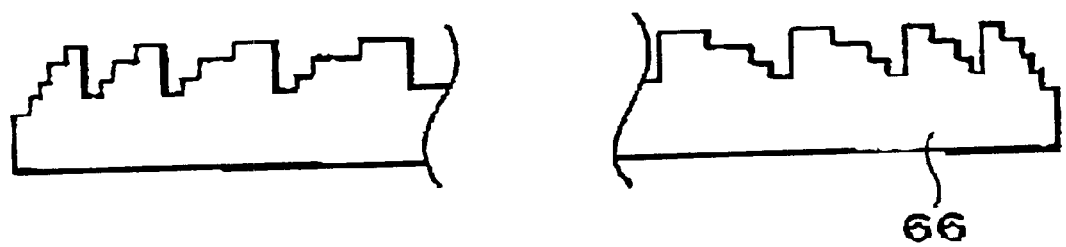
FIG. 69 is a schematic and sectional view of a step-like diffractive optical element to be incorporated into the stepper of the seventh embodiment.

Preferred embodiments of the present invention will now be described with reference to the drawings of FIGS. 1–69.

In a first embodiment of the present invention, as shown in FIG. 1, there is a quartz substrate 1 on which a Cr film 2 is formed by sputtering, as shown in FIG. 2, with a thickness of 1000 angstroms. For enhancement of a patterning resolution, an anti-reflection film (not shown) of chromium oxide, for example, of 200–300 angstroms, may be provided on the Cr film 2.

Then, a photoresist is applied to the quartz substrate 1 and, through an exposure process and a development process, a first-time resist pattern is formed thereon. Subsequently, by using the resist pattern as a mask, the Cr film 2 is etched. Here, the etching process may use a parallel plane plate type RIE (reactive ion etching) apparatus, for example, and an etching gas of a chlorine gas or a mixture gas of chlorine gas and oxygen, for example.

Figure 4:
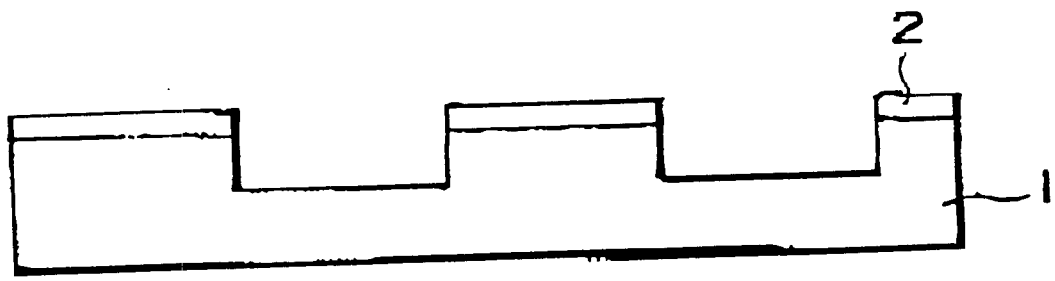

Then, as shown in FIG. 3, the resist pattern is separated in accordance with an oxygen ashing method or by using a removing liquid, whereby a pattern of Cr film 2 is produced. Subsequently, as shown in FIG. 4, by using the Cr film pattern 2 as a mask, the quartz substrate 1 is etched. Here, the etching process may use a RIE (reactive ion etching) apparatus as described above, for example, and an etching gas of a mixture gas of $CF_4$ and hydrogen, for example. The etching conditions may be, for example: $CF_4$ flow rate is 20 sccm, hydrogen flow rate is 3 sccm, pressure is 4 Pa, and RF power is 60 W.

Figure 5:
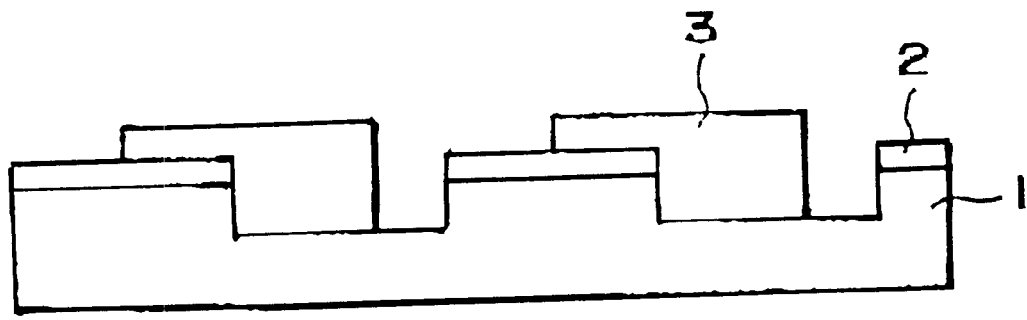
Figure 6:
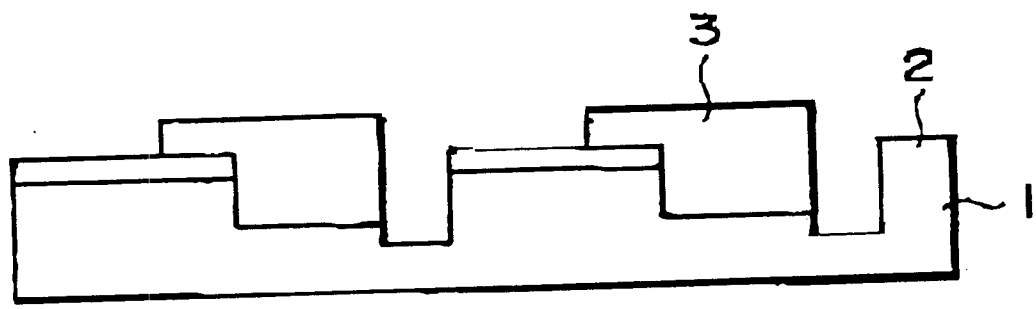

Thereafter, a photoresist is applied to the whole surface and, through an exposure process and a development process, patterning of it is performed as shown in FIG. 5. Then, by using the Cr film 2 and the resist pattern 3 as a mask, the quartz substrate 1 is etched. Here, the etching process may use a RIE (reactive ion etching) apparatus as described, for example, and it may be performed in a similar manner as described above.

Figure 7:
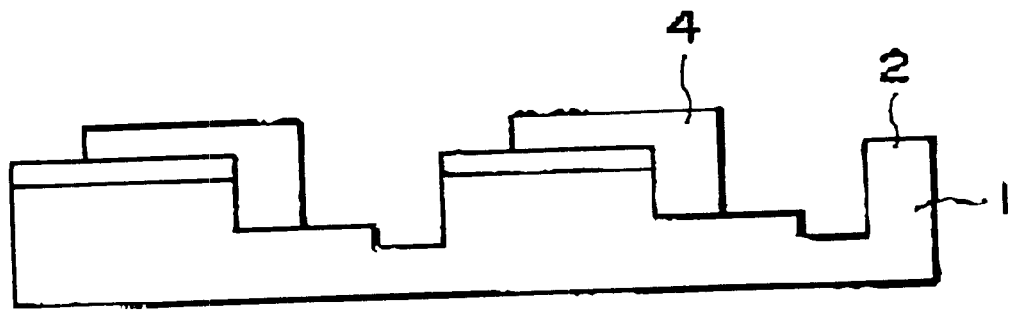
Figure 8:
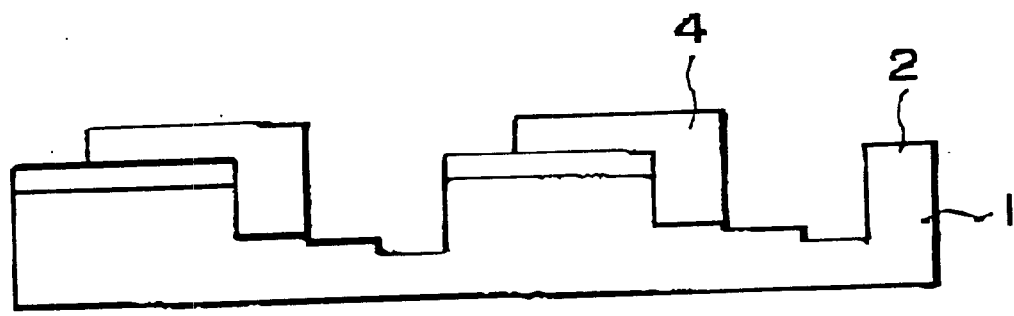
Figure 9:
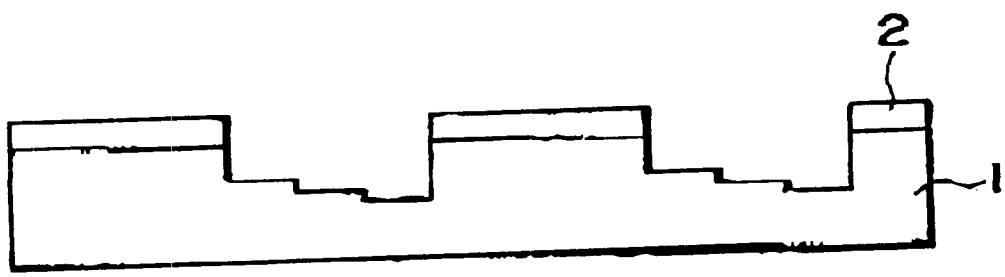

Subsequently, the photoresist pattern 3 is separated and, thereafter, again a photoresist pattern 4 is applied to the whole surface. Through an exposure process and a development process, the patterning of it is accomplished, as shown in FIG. 7. Then, by using the Cr film 2 and the resist pattern 4 as a mask, the quartz substrate 1 is etched, as shown in FIG. 8. As the photoresist pattern 4 is removed, the result such as shown in FIG. 9 is obtained.

Figure 10:
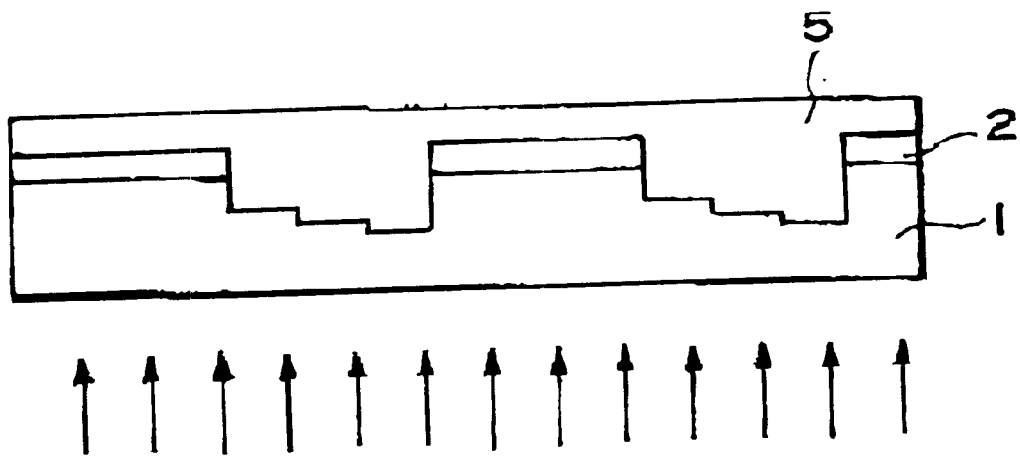
Figure 11:
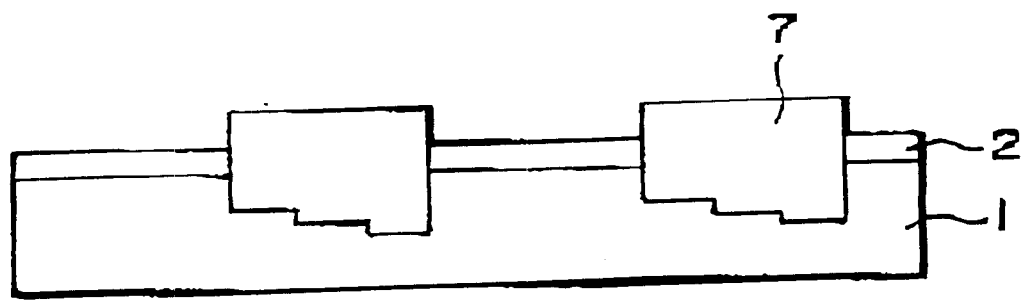

As shown in FIG. 10, a negative type resist 5 is applied to the whole surface, and an exposure of the substrate is performed from the bottom face side of the substrate 1. As a development process is performed, the result is such that, as shown in FIG. 11, a resist pattern 7 is formed only at a portion where no Cr film 2 is present.

Figure 12:
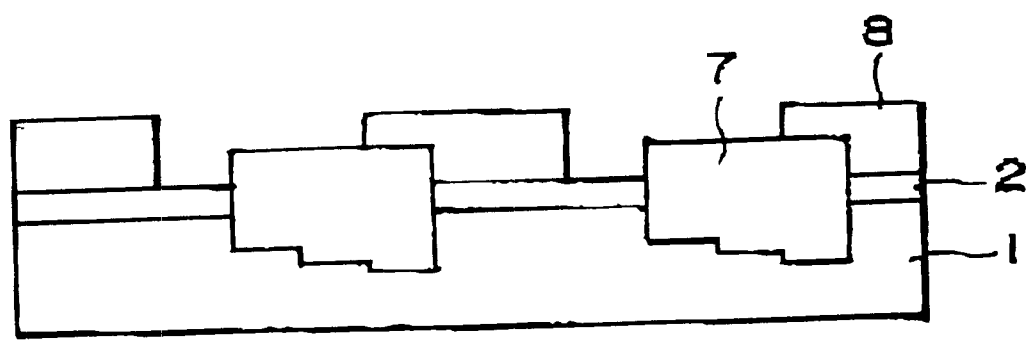
Figure 13:
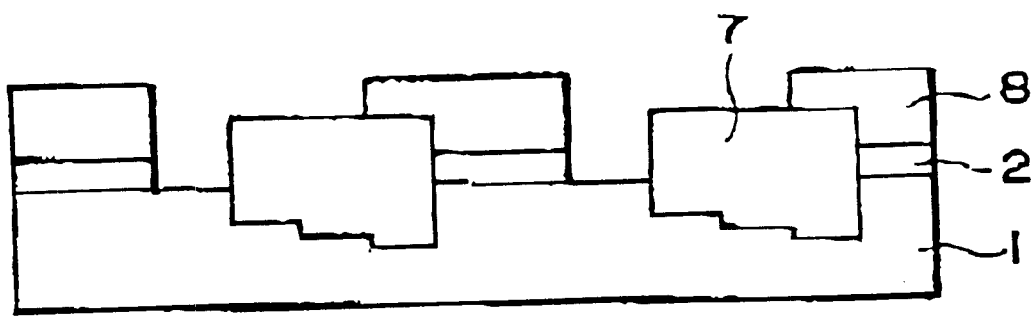

Subsequently, a photoresist is applied to the whole surface, and a pattern 8 is patterned as shown in FIG. 12. Then, as shown in FIG. 13, the portion of the Cr film 2 not covered by the pattern 7 or the pattern 8 is etched. The etching process may be performed in accordance with a RIE (reactive ion etching) method, using a chlorine gas or a mixture gas of chlorine gas and oxygen, for example.

Figure 14:
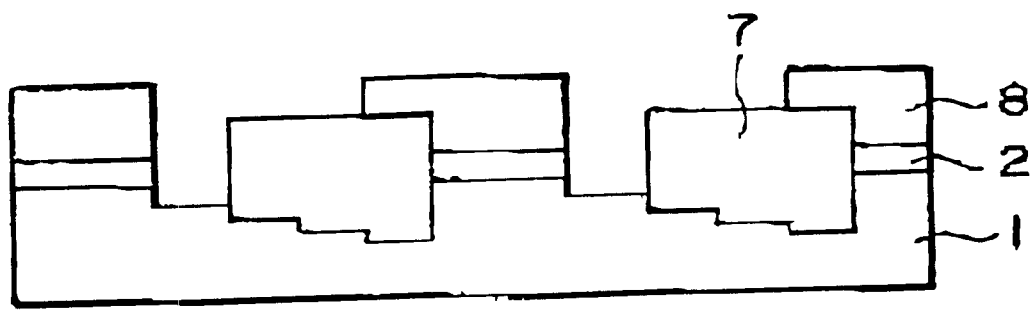
Figure 15:
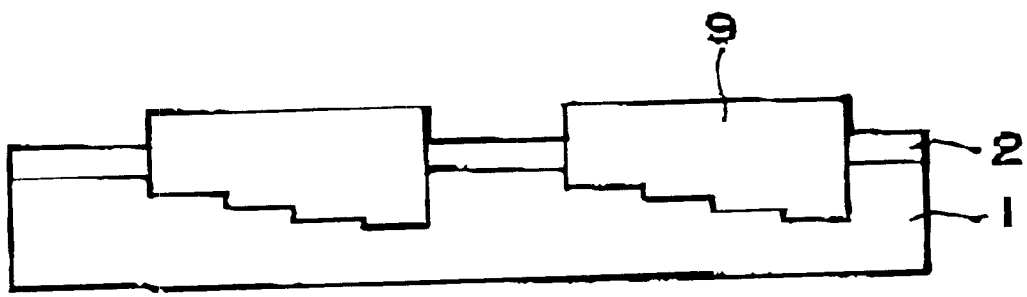

Subsequently, as shown in FIG. 14, by using the patterns 7 and 8 as a mask, the quartz substrate 1 is etched. Thereafter, the patterns 7 and 8 are removed and, then, a negative resist is applied to the whole surface and the exposure operation is performed to the substrate 1 from its bottom face side. As a development process is performed, the result is that, as shown in FIG. 15, a resist pattern 9 is formed only in a portion where the Cr film 2 is not present. Then, a photoresist is applied to the whole surface, and a pattern 10 is patterned through an exposure process and a development process. The Cr film 2 in a portion not covered by the pattern 9 or the pattern 10 is etched in accordance with the RIE method using a chlorine gas or a mixture gas of chloride gas and oxygen, for example, such as shown in FIG. 17.

Figure 19:
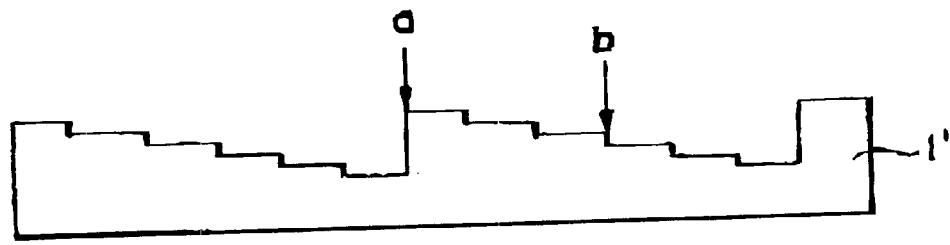

Then, as shown in FIG. 18, by using the patterns 9 and 10 as a mask, the quartz substrate 1 is etched. Finally, the patterns 9 and 10 as well as the Cr film 2 are removed. Here, in the etching process, a liquid mixture of cerium ammonium nitrate, perchloric acid and water, for example, may be used. In this manner, a six-level step-like diffractive optical element 1' such as shown in FIG. 19 is completed.

Positions a and b in this step-like diffractive optical element 1' (FIGS. 3 and 19) are determined in accordance with the first patterning, independently of the alignment. Therefore, the influence of an alignment error can be significantly reduced.

Also, in this embodiment, the optical element can be manufactured at a step of one-third of the minimum resolvable line width of a drawing apparatus. Therefore, an optical element with a higher diffraction efficiency can be produced.

In this embodiment, the highest step a and the third step b therefrom are determined by the first mask. When an element with steps of a number 2n is to be produced, the highest step a and the (n)th step b therefrom are determined by the first mask. Also, two steps (without Cr film) may be formed in a first process while three steps (with Cr film) may be formed in the subsequent process. In that case, the highest step a and the third step b therefrom are determined by the first mask.

Therefore, generally, where steps of n are to be formed in a later process (with Cr film), the highest step a and the (n)th step b therefrom are determined by a first mask.

Figure 20:

In a second embodiment of the present invention, as shown in FIG. 20, there is a quartz substrate 11 on which a Cr film 12 is formed by sputtering, with a thickness 1000 angstroms. Here, an anti-reflection film (not shown) of chromium oxide, for example, may be provided on the Cr film 2 as desired.

Figure 21:
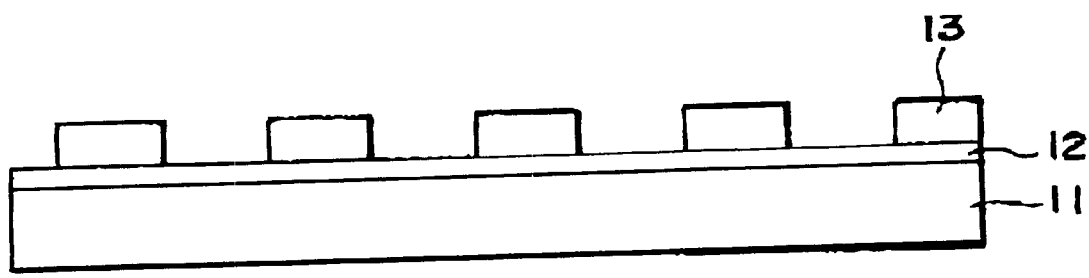

Then, a photoresist is applied to the quartz substrate 11 and, through an exposure process and a development process, a first-time resist pattern 13 is formed thereon, as shown in FIG. 21. Subsequently, by using the resist pattern 13 as a mask, the Cr film 2 is etched. Here, the etching process may use a parallel plane plate type RIE (reactive ion etching) apparatus, for example, and an etching gas of a chlorine gas or a mixture gas of chlorine gas and oxygen, for example.

Then, as shown in FIG. 22, the resist pattern 13 is separated in accordance with an oxygen ashing method or by using a removing liquid. Additionally, as shown in FIG. 23, by using the pattern of Cr film 12 as a mask, the quartz substrate 11 is etched. Here, the etching process may use a RIE (reactive ion etching) apparatus as described above, for example, and an etching gas of a mixture gas of $CF_4$ and hydrogen, for example. The etching conditions may be, for example, as follows: $CF_4$ flow rate is 20 sccm, hydrogen flow rate is 3 sccm, pressure is 4 Pa, and PF power is 60 W.

Thereafter, a photoresist is applied to the whole surface and, through an exposure process and a development process, patterning of it is performed as shown in FIG. 24. Then, by using the Cr film 12 and the resist pattern 14 as a mask, the quartz substrate 11 is etched by a RIE apparatus, such as shown in FIG. 25.

Subsequently, the photoresist pattern 14 is separated and, thereafter, again a negative type resist 15 is applied to the whole surface (FIG. 26). Then, as shown in FIG. 27, the exposure process is performed to the substrate 11, from its bottom face side. Additionally, as shown in FIG. 28, the exposure process is performed by using a photomask 16, from its top face side.

As a development process is performed, the result is that, as shown in FIG. 29, a photoresist pattern 17 is formed only in a portion where the Cr film 12 is not present. Then, as shown in FIG. 30, the Cr film 12 in a portion not covered by the pattern 18 is etched in accordance with the RIE method using a chlorine gas or a mixture gas of chlorine gas and oxygen, for example.

Figure 33:
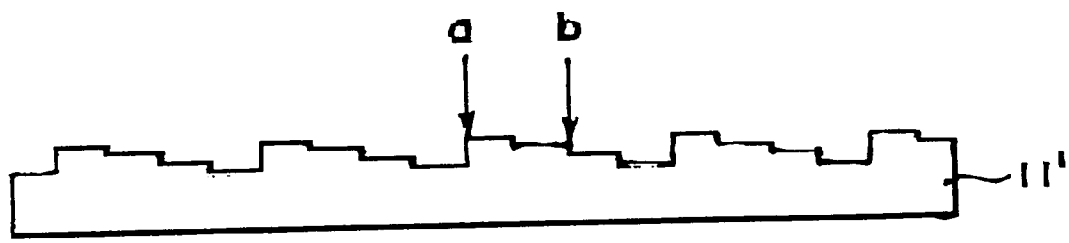

Then, as shown in FIG. 31, by using the pattern 17 as a mask, the quartz substrate 11 is etched. Subsequently, as shown in FIG. 32, the resist pattern 17 is removed and, thereafter, the Cr film 12 is removed. As a result, a four-level step-like diffractive optical element 11' such as shown in FIG. 33 is completed.

Positions a and b in this step-like diffractive optical element 11' (FIG. 33) are determined in accordance with the first patterning of the Cr film 12, independently of the alignment. Therefore, the influence of an alignment error can be significantly reduced.

Figure 34:
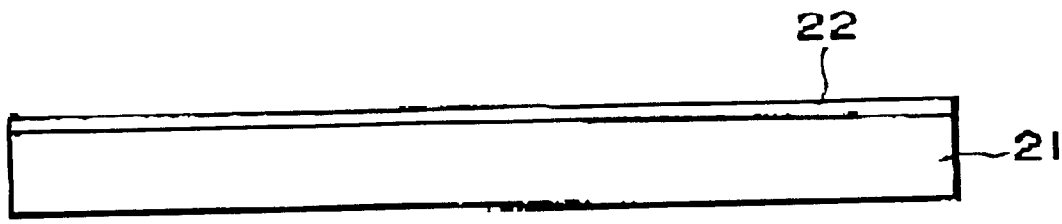

In a third embodiment of the present invention, as shown in FIG. 34, there is a quartz substrate 21 on which a Cr film 22 is formed by sputtering, with a thickness of 1000 angstroms. Here, an anti-reflection film (not shown) of chromium oxide, for example, may be provided on the Cr film 22 as desired.

Figure 35:
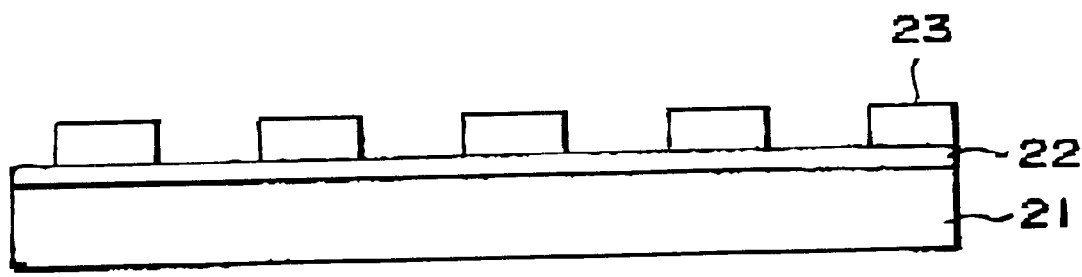

Then, a photoresist is applied to the substrate 21 and, through an exposure process and a development process, a first-time resist pattern 23 is formed thereon, as shown in FIG. 35. Subsequently, by using the resist pattern 23 as a mask, the Cr film 22 is etched. Here, in the etching process, a parallel plane plate type RIE (reactive ion etching) apparatus, for example, and an etching gas of a chlorine gas or a mixture gas of chlorine gas and oxygen, for example, may be used. Then, the resist pattern 23 is separated in accordance with an oxygen ashing method or by using a removing liquid.

Figure 36:
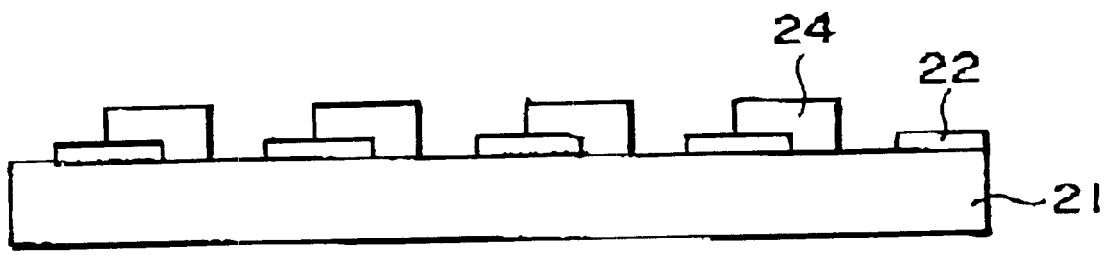
Figure 37:
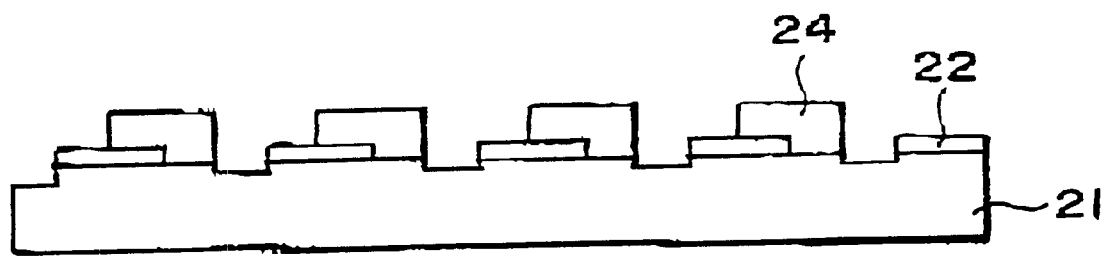
Figure 38:
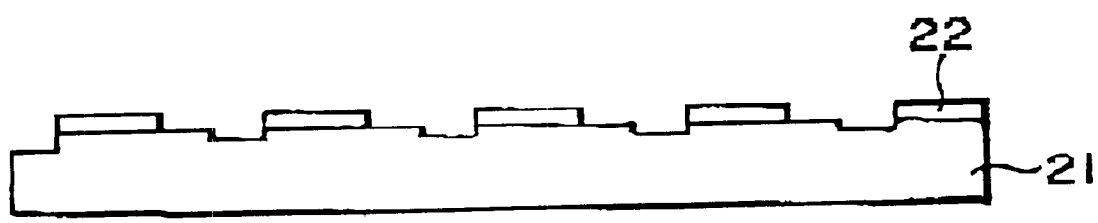

Thereafter, a photoresist is applied to the whole surface and, through an exposure process and a development process, a resist pattern 24 such as shown in FIG. 36 is formed. Then, as shown in FIG. 37, by using the Cr film 22 and the resist pattern 24 as a mask, the quartz substrate 21 is etched. Then, the resist pattern 24 is removed (FIG. 38).

Figure 39:
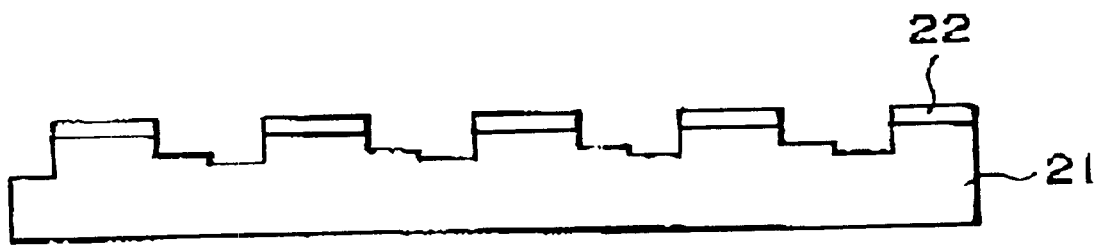

Subsequently, as shown in FIG. 39, by using the pattern of Cr film 22 as a mask, the quartz substrate 21 is etched by using a RIE (reactive ion etching) apparatus as described above, for example. The etching gas may be a mixture gas of $CF_4$ and hydrogen, for example. The etching conditions may be, for example, as follows: $CF_4$ flow rate is 20 sccm, hydrogen flow rate is 3 sccm, pressure is 4 Pa, and RF power is 60 W.

Figure 40:
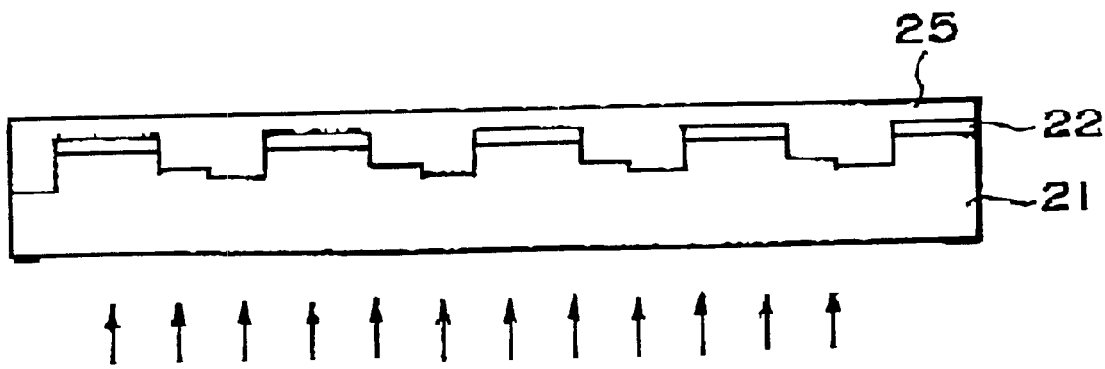
Figure 41:
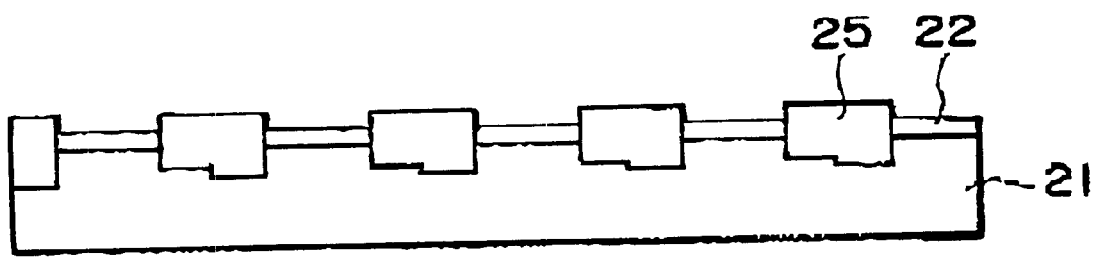

Thereafter, as shown in FIG. 40, a photoresist 25 is applied to the whole surface, and an exposure process is performed to the substrate 21 from its bottom face side. As a development process is performed, the result is such as shown in FIG. 41. Then, as shown in FIG. 42, a photoresist is applied to the whole surface and, through an exposure process and a development process, a resist pattern 26 is patterned. Thereafter, as shown in FIG. 43, the Cr film 22 is etched by using a mixture liquid of cerium ammonium nitrate, perchloric acid and water, for example, while using the resist patterns 25 and 26 as a mask.

Subsequently, as shown in FIG. 44, by using the resist patterns 25 and 26 as a mask, the quartz substrate 21 is etched. Then, as shown in FIG. 45, the resist patterns 25 and 26 are removed, and the Cr film 22 is etched. Then, a four-level step-like diffractive optical element 21' as shown in FIG. 46 is completed.

Positions a and b in this step-like diffractive optical element 21' (FIG. 46) are determined in accordance with the first patterning of the Cr film 22, independently of the alignment. Therefore, the influence of an alignment error can be significantly reduced.

Also, in this embodiment, the optical element can be manufactured at a step of a half of the minimum resolvable line width of a drawing apparatus. Therefore, an optical element with a higher diffraction efficiency can be produced.

In a fourth embodiment of the present invention, as shown in FIG. 47, there is a quartz substrate 31 on which a Cr film 32 is formed by sputtering, with a thickness of 1000 angstroms. Here, an anti-reflection film of chromium oxide, for example, may be provided on the Cr film 32 as desired.

Figure 48:
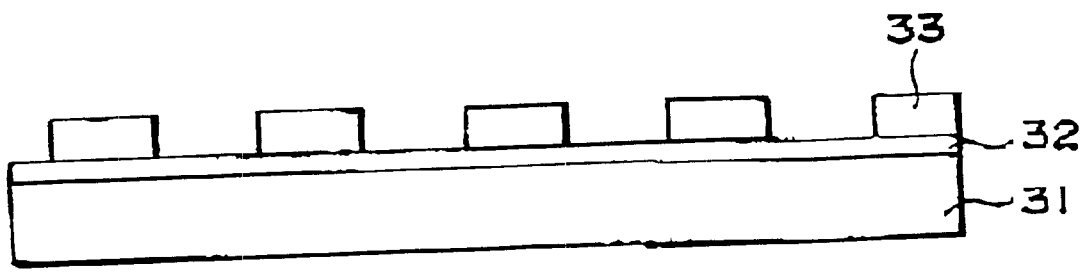

Then, a photoresist is applied to the quartz substrate 31 and, through an exposure process and a development process, a first-time resist pattern 33 is formed thereon, as shown in FIG. 48. Subsequently, by using the resist pattern 33 as a mask, the Cr film 32 is etched. Here, the etching process may use a parallel plane plate type RIE (reactive ion etching) apparatus, for example, and an etching gas of a mixture gas of chlorine gas and oxygen, for example.

Figure 49:
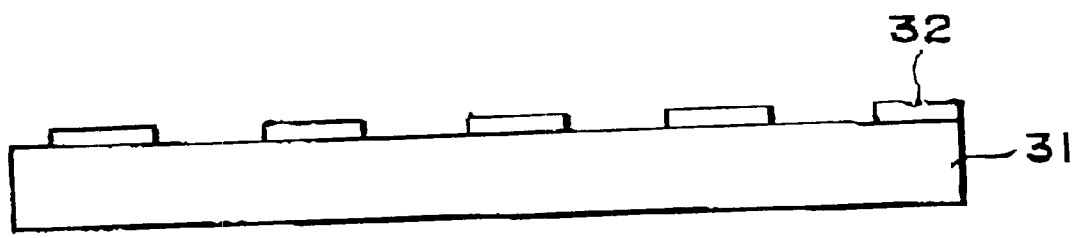
Figure 50:
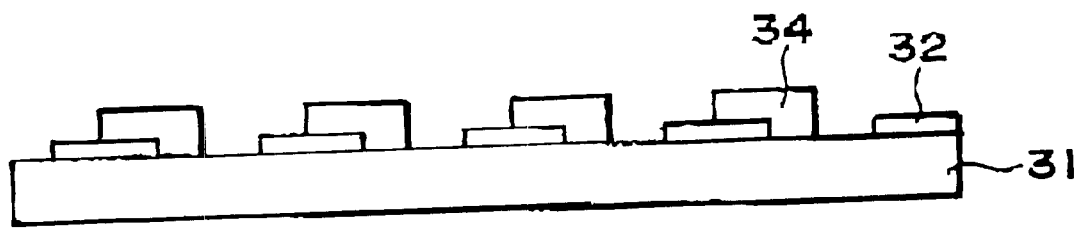

Then, as shown in FIG. 49, the resist pattern 33 is separated in accordance with an oxygen ashing method or by using a removing liquid. Subsequently, a photoresist is applied to the whole surface and, through an exposure process and a development process, a resist pattern 34 such as shown in FIG. 50 is formed. Then, as shown in FIG. 51, by using the Cr film 32 and the resist pattern 34 as a mask, the quartz substrate 31 is etched.

Thereafter, the resist pattern 34 is removed (FIG. 51). Then, as shown in FIG. 52, by using the pattern of Cr film 32 as a mask, the quartz substrate 31 is etched. Here, the etching process may be performed in accordance with a RIE (reactive ion etching) apparatus as described above, for example, and by use of an etching gas of a mixture gas of $CF_4$ and hydrogen, for example. The etching conditions may be, for example as follows: $CF_4$ flow rate is 20 sccm, hydrogen flow rate is 3 sccm, pressure is 4 Pa, and RF power is 60 W.

Thereafter, as shown in FIG. 54, the photoresist is removed and, then, a negative type resist pattern 35 is applied to the whole surface. Then, an exposure process is performed to the substrate 31 from its bottom face side (FIG. 55). Also, an exposure process is performed by using a photomask 36, from the top face side of the substrate. As a development process is performed, a resist pattern 37 such as shown in FIG. 57 is produced.

Thereafter, as shown in FIG. 58, a portion of the Cr film 32 not covered by the pattern 37 is etched, by using a mixture liquid of cerium ammonium nitrate, perchloric acid and water, for example. Subsequently, as shown in FIG. 59, by using the pattern 37 as a mask, the quartz substrate 31 is etched. Then, as shown in FIG. 60, the resist pattern 37 is removed, and the Cr film 32 is removed by etching. Then, a four-level step-like diffractive optical element 31' as shown in FIG. 61 is completed.

Positions a and b in this step-like diffractive optical element 31' (FIG. 61) are determined in accordance with the first Cr film 32, independently of the alignment. Therefore, the influence of an alignment error can be significantly reduced.

Also, in this embodiment, the optical element can be manufactured at a step of a half of the minimum resolvable line width of a drawing apparatus. Therefore, an optical element of higher diffraction efficiency can be produced.

In a fifth embodiment of the present invention, a step-like diffractive optical element made of resin can be manufactured while using a step-like substrate, produced in accordance with any of the first to fourth embodiments, as a mold.

Initially, as shown in FIG. 62, a reaction setting resin, that is, ultraviolet radiation setting resin such as that of the acrylic series or epoxy series, or a thermo-setting resin, denoted at 43, is applied by drops to a glass substrate 41 by a cylinder 42. Subsequently, as shown in FIGS. 63 and 64, a step-like shape substrate 44 having been manufactured in accordance with any one of the first to fourth embodiments, is pressed against the resin 43 from above, whereby a replica layer 45 of the resin 43 is formed.

Figure 65:
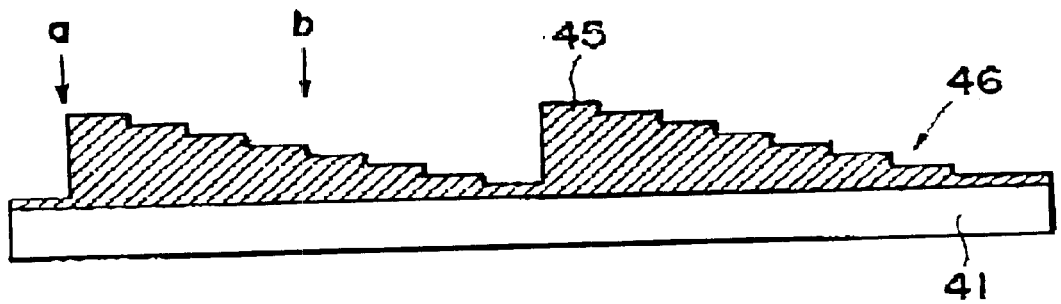

Here, before the substrate 44, which functions as a mold, is pressed against the resin 43, a mold releasing agent may be applied to the surface, as required. Subsequently, where an ultraviolet radiation setting resin is used, ultraviolet radiation is projected to the resin from the substrate (mold) 41 side, to solidify the resin. Where a thermo-setting resin is used, a heating treatment is performed to harden the resin. Subsequently, the substrate (mold) 44 is released, whereby a step-like diffractive optical element 46 as shown in FIG. 65 is completed.

Positions a and b in this step-like diffractive optical element 46 (FIG. 65) are determined in accordance with the first Cr film for the step-like substrate 44, independently of the alignment. Therefore, the influence of an alignment error can be significantly reduced.

Also, in this embodiment, the optical element can be manufactured at a step of a half to one-third of the minimum resolvable line width of a drawing apparatus. Therefore, an optical element of higher diffraction efficiency can be produced.

Figure 66:
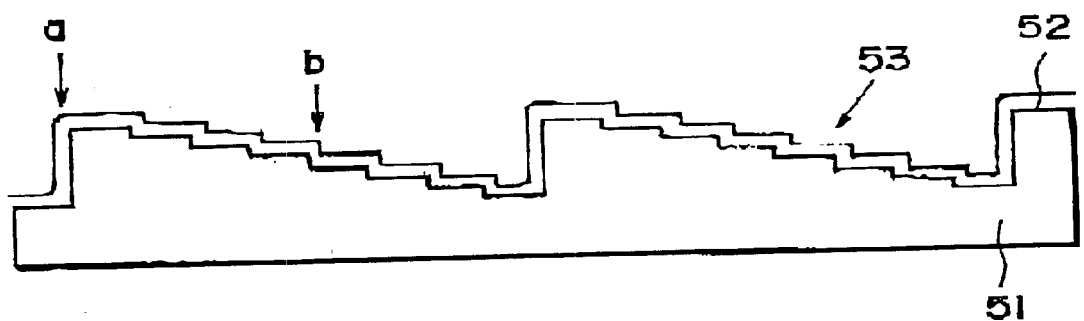
FIG. 66 is a schematic and sectional view for explaining a reflection type element.

In a sixth embodiment, as shown in FIG. 66, a step-like shape substrate 51 produced in accordance with any one of the first to fourth embodiments may be provided with an aluminum film 52, formed by sputtering and with a thickness of 1000 angstroms. A reflection type step-like diffractive optical element 53 can be completed in this manner.

Positions a and b in this step-like diffractive optical element 53 (FIG. 66) are determined in accordance with the first Cr pattern for the step-like substrate 51, independently of the alignment. Therefore, the influence of an alignment error can be significantly reduced.

Also, in this embodiment, the optical element can be manufactured at a step of a half to one-third of the minimum resolvable line width of a drawing apparatus. Therefore, an optical element of a higher diffraction efficiency can be produced.

Figure 67:
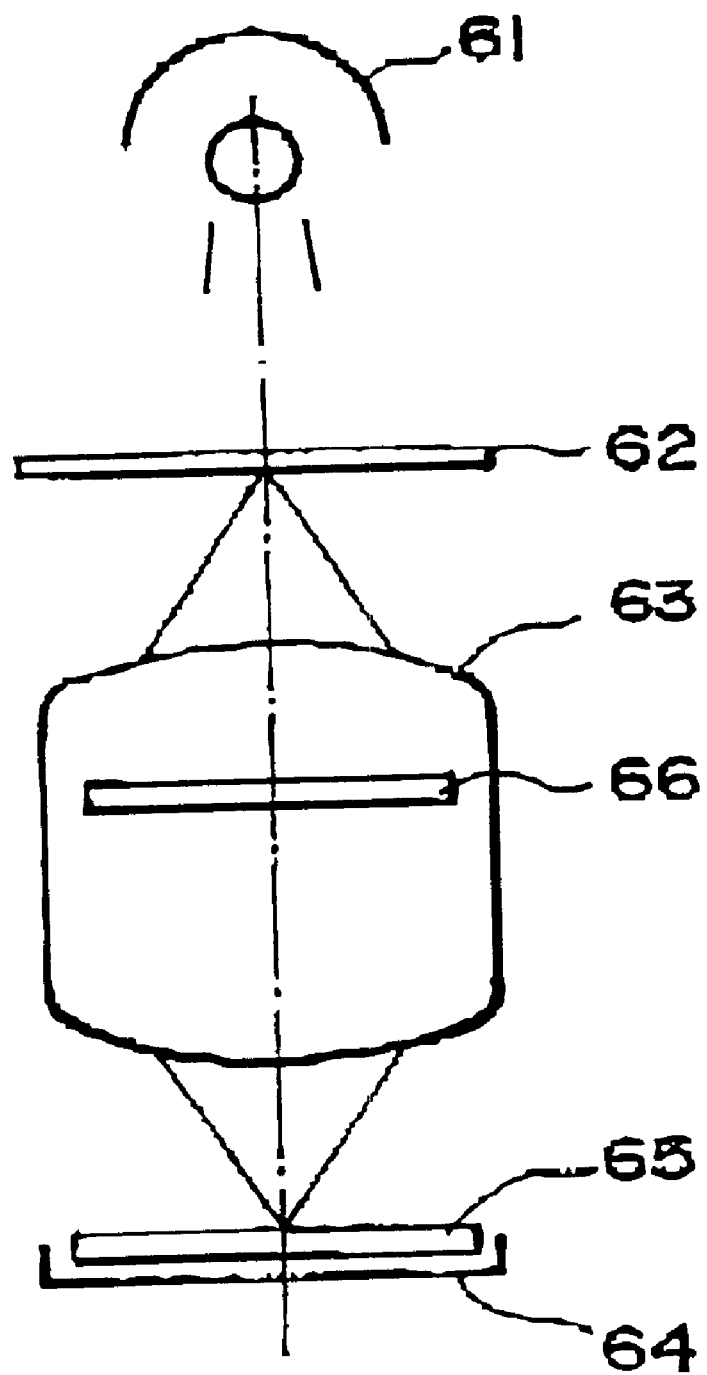
FIG. 67 is a schematic view of a stepper according to a seventh embodiment of the present invention.

In a seventh embodiment, a diffractive optical element as manufactured in accordance with the first embodiment may be incorporated into a semiconductor exposure apparatus (stepper), as shown in FIG. 67, which uses ultraviolet radiation such as i-line or KrF, for example.

This exposure apparatus is arranged so that a reticle 62 is irradiated with light at a wavelength 248 nm from an illumination system 61, and a pattern formed on the reticle 62 is transferred to a semiconductor substrate 65 placed on a stage 64, by an imaging optical system 63, at a reduction magnification of 1:5. The imaging optical system 63 is provided with a diffractive optical element 66 having been manufactured in accordance with the method of the first embodiment, this being for the purpose of reduction of chromatic aberration and the provision of aspherical effect.

Figure 68:
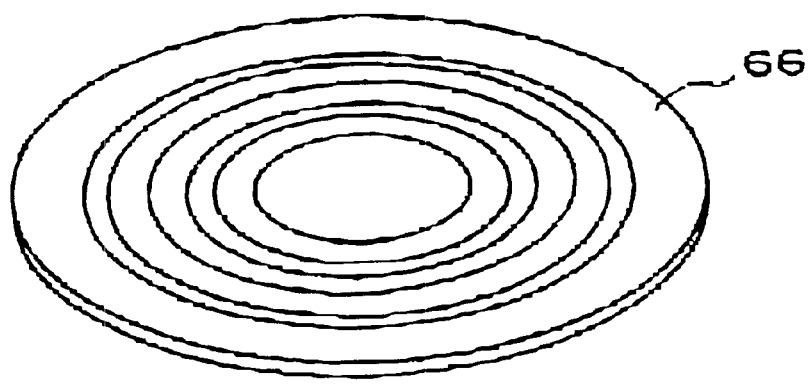
FIG. 68 is a schematic view of a step-like diffractive optical element to be incorporated into the stepper of the seventh embodiment.

This diffractive optical element 66 may have an appearance as illustrated in a perspective view of FIG. 68. It may have a sectional shape such as shown in FIG. 69. Optically, it functions as a convex lens. Although FIG. 69 shows an example of four-level structure, the following description will be made on an example with an eight-level structure. The surface level difference per single step is 610 angstroms, and the width of the outermost peripheral step is 0.35 micron. The diameter of the element 66 is 120 mm.

When light is incident on the diffractive optical element 66, it may be transmitted therethrough while being separated mainly into a first order diffraction light, ninth order diffraction light and seventeenth order diffraction light. Of course, only the first order light contributes the imaging, and it occupies 90% or more of the incident light. The remaining few percent correspond to the ninth order light and the seventeenth order light. Since these diffraction orders are considerably different from the first order light that contributes to the imaging, these diffraction lights are directed out of the imaging optical system 63 and they do not have a large influence on the imaging.

Figure 70:
FIG. 70 is a schematic view for explaining the background of the present invention.

This should be compared with the optical element of FIG. 70 described above. An intense diffraction light of the third order, for example, will be produced between the first and ninth orders of light when the optical element of FIG. 70, which is manufactured by using masks A, B and C, has three levels with a 610 angstrom level difference, a 0.35 micron width at the most peripheral step and a 120 mm diameter.

Such unwanted light causes flare or the like upon the image plane resulting in a large deterioration of the image performance.

While the invention has been described with reference to the structures disclosed herein, it is not confined to the details set forth and this application is intended to cover such modifications or changes as may come within the purposes of the improvements or the scope of the following claims.

What is claimed is:

1. A method of manufacturing an element having a multiple-level step-like shape through plural lithographic processes, said method comprising:
   (i) covering a second region of a sample with a first mask, wherein the second region corresponds to plural steps of the step-like shape;
   (ii) covering a portion of a first region and a portion of the second region with a second mask;
   (iii) etching the sample using the first mask and the second mask, wherein an end portion of a pattern of the first mask and an end portion of a pattern of the second mask do not overlap;
   (iv) removing the second mask;
   (v) covering the first region with a third mask;
   (vi) covering a portion of the second region and a portion of the first region with a fourth mask; and
   (vii) etching the sample using the third mask and the fourth mask, wherein an end portion of a pattern of the third mask and an end portion of a pattern of the fourth mask do not overlap,
   wherein a position of a step of the multiple-level step-like shape of the element is determined by the pattern of the first mask, a portion of the pattern of the second mask and a portion of the pattern of the fourth mask.

2. The method according to claim 1, wherein the sample comprises a light transmissive substrate, the first mask comprises a light blocking material, and the third mask comprises a negative type resist and wherein rear exposure is performed from a side of the sample.

3. The method according to claim 1, wherein the sample comprises a light transmissive substrate, the first mask comprises one of a chromium film and a lamination film of chromium and chromium oxide, the third mask comprises a negative type resist and wherein rear exposure is performed from a side of the sample.

4. A multiple-level diffractive optical element manufactured by a method according to claim 1.

5. An optical system comprising an element manufactured by a method according to claim 1.

6. An exposure apparatus comprising an optical system according to claim 5.

7. A device manufacturing method comprising exposing an article by using an exposure apparatus according to claim 5.

8. A method of manufacturing an element having a multiple-level step-like shape through plural lithographic processes, said method comprising:
   (i) covering a second region of a sample with a first mask, wherein the second region corresponds to plural steps of the step-like shape;
   (ii) covering a portion of a first region and a portion of the second region with a second mask; and
   (iii) etching the sample using the first mask and the second mask, wherein an end portion of a pattern of the first mask and an end portion of a pattern of the second mask do not overlap;

(iv) removing the second mask;

(v) covering the first region and a portion of the second region with a third mask; and (vi) etching the sample using the third mask, wherein a position of a step of the multiple-level step-like shape of the element is determined by the pattern of the first mask, a portion of the pattern of the second mask and a portion of a pattern of the third mask.

9. The method according to claim 8, wherein the sample comprises a light transmissive substrate, the first mask comprises a light blocking material, the third mask comprises a negative type resist and wherein rear exposure is performed from a side of the sample.

10. The method according to claim 8, wherein the sample comprises a light transmissive substrate, the first mask comprises one of a chromium film and a lamination film of chromium and chromium oxide, the third mask comprises a negative type resist and wherein rear exposure is performed from a side of the sample.

11. A multiple-level diffractive optical element manufactured by a method according to claim 8.

12. An optical system comprising an element manufactured by a method according to claim 8.

13. An exposure apparatus comprising an optical system according to claim 12.

14. A device manufacturing method comprising exposing an article by using an exposure apparatus according to claim 12.

15. A method of manufacturing an element having a multiple-level step-like shape through plural lithographic processes, said method comprising:

(i) covering a second region of a sample with a first mask, wherein the second region corresponds to plural steps of the step-like shape;

(ii) etching the sample using the first mask;

(iii) covering a portion of the first region and a portion of the second region with a second mask;

(iv) etching the sample using the first mask and the second mask, wherein an end portion of a pattern of the first mask and an end portion of a pattern of the second mask do not overlap;

(v) removing the second mask;

(vi) covering the first region with a third mask;

(vii) covering a portion of the second region and a portion of the first region with a fourth mask; and (viii) etching the sample using the third mask and the fourth mask, wherein an end portion of a pattern of the third mask and an end portion of a pattern of the fourth mask do not overlap, wherein a position of a step of the multiple-level step-like shape of the element is determined by the pattern of the first mask, a portion of the pattern of the second mask and a portion of the pattern of the fourth mask.

16. The method according to claim 15, wherein the sample comprises a light transmissive substrate, the first mask comprises a light blocking material, the third mask comprises a negative type resist and wherein rear exposure is performed from a side of the sample.

17. The method according to claim 15, wherein the sample comprises a light transmissive substrate, the first mask comprises one of a chromium film and a lamination film of chromium and chromium oxide, the third mask comprises a negative type resist and wherein rear exposure is performed from a side of the sample.

18. A multiple-level diffractive optical element manufactured by a method according to claim 15.

19. An optical system comprising an element manufactured by a method according to claim 15.

20. An exposure apparatus comprising an optical system according to claim 19.

21. A device manufacturing method comprising exposing an article by using an exposure apparatus according to claim 19.

22. A method of manufacturing an element having a multiple-level step-like shape through plural lithographic processes comprising covering a second region of a sample with a first mask, wherein the second region corresponds to plural steps of the step-like shape;

covering a portion of the first region and a portion of the second region with a second mask; and etching the sample using the first mask and the second mask as an etching mask, wherein an end portion of a pattern of the first mask and an end portion of a pattern of the second mask do not overlap and wherein a first end of the etching mask overlaps with an end portion of the first mask and a second end of the etching mask overlaps with an end portion of the second mask.

23. A multiple-level diffractive optical element manufactured by a method according to claim 22.

24. An optical system including an element manufactured by a method according to claim 22.

25. An exposure apparatus comprising an optical system according to claim 24.

26. A device manufacturing method comprising method comprising exposing an article by using an exposure apparatus according to claim 25.

* * * * *

UNITED STATES PATENT AND TRADEMARK OFFICE
CERTIFICATE OF CORRECTION

PATENT NO.   : 6,569,608 B2
DATED        : May 27, 2003
INVENTOR(S)  : Ichiro Tanaka et al.

It is certified that error appears in the above-identified patent and that said Letters Patent is hereby corrected as shown below:

Column 1,
Line 45, "which corresponds to Japanese Laid-Open Patent" should read
-- and U.S. Patent No. 2,554,600 --;
Line 46, should be deleted; and
Line 47, "5,324,600" should be deleted.

Column 12,
Line 26, "comprising" should read -- comprising: --;
Line 37, "overlap" should read -- overlap, --;
Line 49, "method" (second occurrence) should be deleted; and
Line 50, "comprising" should be deleted.

Signed and Sealed this

Second Day of March, 2004

JON W. DUDAS
*Acting Director of the United States Patent and Trademark Office*